(12) United States Patent
Seo et al.

(10) Patent No.: US 7,324,798 B2
(45) Date of Patent: Jan. 29, 2008

(54) $2^N$-ORDER SUB-HARMONIC FREQUENCY MODULATOR HAVING HIGH CARRIER SUPPRESSION RATIO AND DIRECT CONVERSION TRANSMITTER USING THE SAME

(75) Inventors: Hae-Moon Seo, Young-In-Si (KR);
Kwang-Ho Won, Young-In-Si (KR);
Yong Kuk Park, Seoul (KR);
Myung-Hyun Yoon, Seongnam (KR);
June-Jae Yoo, Seoul (KR)

(73) Assignee: Korea Electronics Technology Institute, Kyung-Gi-Do (KR)

( * ) Notice: Subject to any disclaimer, the term of this patent is extended or adjusted under 35 U.S.C. 154(b) by 570 days.

(21) Appl. No.: 10/899,148

(22) Filed: Jul. 27, 2004

(65) Prior Publication Data

US 2005/0255806 A1    Nov. 17, 2005

(30) Foreign Application Priority Data

May 17, 2004  (KR) ............... 10-2004-0034719

(51) Int. Cl.
*H04B 1/26* (2006.01)
(52) U.S. Cl. .................. 455/324; 455/42; 455/43; 455/102; 455/110; 455/112
(58) Field of Classification Search .............. 455/20, 455/42, 43, 102, 110, 112, 118, 324; 375/302
See application file for complete search history.

(56) References Cited

U.S. PATENT DOCUMENTS 5,303,417 A * 4/1994 Laws ..................... 455/314

5,428,837 A * 6/1995 Bayruns et al. ............ 455/317
5,530,929 A * 6/1996 Lindqvist et al. .......... 455/324
6,487,398 B1 * 11/2002 Nobbe et al. ............... 455/118

(Continued)

FOREIGN PATENT DOCUMENTS

WO        WO 03/021718 A1     3/2003

*Primary Examiner*—Nay Maung
*Assistant Examiner*—Fayyaz Alam
(74) *Attorney, Agent, or Firm*—Sughrue Mion, PLLC

(57) ABSTRACT

Disclosed herein is a $2^N$-order sub-harmonic frequency modulator and direct conversion transmitter using the same. The direct conversion transmitter includes a digital modulation unit, a D/A conversion unit, a DC correction and low pass filter unit, a local oscillator, a poly phase signal generation unit, a $2^N$-order sub-harmonic I/Q frequency modulation unit, a power amplification unit, and an antenna. The digital modulation unit digitally modulates a base-band signal and then outputs I and Q component signals. The D/A conversion unit converts the I and Q component signals into analog I and Q component signals. The DC correction and low pass filter unit adjusts DC interfaces of the analog I and Q component signals, passes low frequency components of the analog I and Q component signals and generates I and Q components of a base-band signal. The local oscillator generates a sine wave signal with a frequency of $F_{TX}/2^N$. The poly phase signal generation unit generates a poly phase signal with $2^{N+1}$ phases. The frequency modulation unit mixes the I and Q components with the poly phase signal with $2^{N+1}$ phases to generate an output signal with a frequency of $F_{TX}$. The power amplification unit amplifies the output of the frequency modulation unit to a required level. The antenna radiates the output signal of the power amplification unit.

8 Claims, 7 Drawing Sheets

U.S. PATENT DOCUMENTS

| | | | |
|---|---|---|---|
| 6,600,911 B1 * | 7/2003 | Morishige et al. | 455/307 |
| 6,731,923 B2 * | 5/2004 | Atkinson | 455/323 |
| 7,016,662 B1 * | 3/2006 | Manku et al. | 455/323 |
| 7,031,672 B2 * | 4/2006 | Malone et al. | 455/110 |
| 2001/0039182 A1 * | 11/2001 | Atkinson | 455/20 |
| 2001/0041546 A1 * | 11/2001 | Kazakevich | 455/118 |
| 2003/0045248 A1 * | 3/2003 | Chominski | 455/118 |
| 2004/0021506 A1 * | 2/2004 | Tanase | 327/552 |
| 2004/0063419 A1 * | 4/2004 | Molnar et al. | 455/323 |
| 2005/0032486 A1 * | 2/2005 | Malone et al. | 455/118 |
| 2006/0154625 A1 * | 7/2006 | Malone et al. | 455/118 |

* cited by examiner

$2^N$-ORDER SUB-HARMONIC FREQUENCY MODULATOR HAVING HIGH CARRIER SUPPRESSION RATIO AND DIRECT CONVERSION TRANSMITTER USING THE SAME

BACKGROUND OF THE INVENTION

1. Field of the Invention

The present invention relates, in general, to a $2^N$-order sub-harmonic frequency modulator having a high carrier suppression ratio (N is a natural number equal to or greater than 1) and direct conversion transmitter using the frequency modulator and, more particularly, to a $2^N$-order sub-harmonic frequency modulator (N is a natural number equal to or greater than 1) and direct conversion transmitter using the frequency modulator, in which a local oscillator generates and uses a signal with a frequency of $1/2^N$ of an output frequency, thus improving carrier suppression ratio characteristics, reducing power consumption, realizing a small-sized transmitter, and reducing manufacturing costs.

2. Description of the Related Art

Recently, research has been carried out to develop the one-chip solution for reducing the power consumption of a wireless communication system. A transmitter used in a conventional wireless communication system employs a superheterodyne scheme. This scheme converts a low frequency signal including actual information, such as voices or images, into an Intermediate Frequency (IF) signal, imposes the IF signal on a high frequency carrier, and transmits the carrier, which is disadvantageous in that a hardware construction is complicated and power consumption is increased.

In order to solve the disadvantages of the conventional superheterodyne scheme, a direction conversion scheme allowing a base-band signal to be up-converted to a carrier without using an intermediate frequency has been utilized. The direct conversion scheme is advantageous in that it has the lowest power consumption among transmitter schemes in a wireless communication system, realizes a small-sized transmitter, and enables a transmitter to be produced at low cost.

FIG. 1 is a view showing an example of the construction of a conventional direct conversion transmitter. As shown in FIG. 1, a conventional direct conversion transmitter 100 includes a digital modulation unit 110, a Digital/Analog (D/A) conversion unit 120, a Direct Current (DC)-correction and low pass filter unit 130, a frequency modulation unit 140 having an I-modulation unit 143 and a Q-modulation unit 146, a poly phase filter 150, a local oscillator 160, a power amplification unit 170, and an antenna 180. In such a conventional transmitter construction, the output frequency $F_{TX}$ of the power amplification unit 160 is equal to the frequency $F_{LO}$ of the local oscillator 150. Therefore, there may occur a TX output-to-Local Oscillator Injection Pulling (TXLO-IP) phenomenon, in which the output frequency of the power amplification unit 160 is applied to the local oscillator 150 to influence the local oscillator 150 during the mixing of frequencies. Therefore, it is difficult to use the transmitter of FIG. 1 for a system requiring high power output, and also even for a system requiring low power output if a leakage component is great.

Various schemes have been proposed to solve the problems. For example, a technology of preventing signal distortion is disclosed in U.S. Pat. Appl. Publication No. U.S. 2003/0045248 entitled "Direct modulation transmitter utilizing signals squaring" filed by Chominski and published in Mar. 6, 2003, in which square root values on signals are obtained and then applied to a direct conversion modulator so as to prevent signal distortion occurring at the time of direct conversion. Further, this patent describes that, since the output signal of the transmitter and the local oscillator are not operated at the same frequency, TXLO-IP is improved. However, in the patent of Chominsky, a fundamental improvement plan for TXLO-IP itself is not disclosed.

Further, a direct conversion transmitter employing a low noise architecture is disclosed in PCT International Publication No. WO 03/021718 entitled "Low noise architecture for a direct conversion transmitter" filed by Motorola, Inc and published in Mar. 13, 2003. The Motorola patent discloses the architecture of a transmitter that includes a local oscillator (LO) generating a differential input LO signal actually equal to a required RF transmission frequency, a poly phase system receiving the differential input LO signal to generate first and second phase shift differential LO signals, and a quadrature mixer mixing signals using the first and second phase shift differential LO signals to generate an RF transmission signal. However, if this scheme is used, the amount of leakage occurring in the local oscillator is reduced to some degree with respect to high power signals, but the leakage is not fully prevented.

Further, a direct-conversion modulation scheme is disclosed in U.S. Pat. Appl. Publication No. U.S. 2001/0041546 entitled "Direct-conversion modulation with reduced local oscillator leakage" filed by Kazakevich and published in Nov. 15, 2001, in which two mixers are used, a first mixer mixes a signal having a frequency of half a carrier frequency with a signal to be converted, and a second mixer mixes a signal that has a frequency of half the carrier frequency and has a phase orthogonal to a carrier phase with the output signal of the first mixer. However, this scheme is problematic in that TXLO-IP is not fully eliminated.

SUMMARY OF THE INVENTION

Accordingly, the present invention has been made keeping in mind the above problems occurring in the prior art, and an object of the present invention is to provide a direct conversion transmitter, which employs a $2^N$-order sub-harmonic frequency modulator, thus fully solving a transmission (Tx) output-to-Local Oscillator (LO) injection pulling (TXLO-IP) problem, improving carrier suppression ratio characteristics, reducing power consumption, realizing a small-sized transmitter, and reducing manufacturing costs.

In order to accomplish the above object, the present invention provides an I/Q frequency modulator for a direct conversion transmitter, comprising an I/Q input unit receiving In-phase (I) and Quadrature-phase (Q) component signals, an I switching unit receiving and modulating sub-harmonic signals with a frequency of $F_{TX}/2^N$ and $2^{N+1}$ phases (N is a natural number equal to or greater than 1) and the I component signals and then outputting a signal with a frequency of $F_{TX}$, a Q switching unit receiving and modulating the sub-harmonic signals and the Q component signals and then outputting a signal with a frequency of $F_{rx}$, a load unit functioning as a load, and an output unit providing output signals of the I and Q switching units as Radio Frequency (RF) signals.

Further, the present invention provides an I/Q frequency modulator for a direct conversion transmitter, comprising an I/Q input unit receiving I and Q component signals, an I switching unit receiving and modulating sub-harmonic signals with a frequency of $F_{TX}/N$ and 2N phases (N is a natural number equal to or greater than 2) and the I component signals and outputting a signal with a frequency of $F_{TX}$, a Q switching unit receiving and modulating the sub-harmonic signals and the Q component signals and outputting a signal with a frequency of $F_{TX}$, a load unit functioning as a load, and an output unit providing output signals of the I and Q switching units as Radio Frequency (RF) signals.

Further, the present invention provides a direct conversion transmitter, comprising a digital modulation unit digitally modulating a base-band signal and then outputting I and Q component signals, a digital/analog conversion unit converting the I and Q component signals, which are output from the digital modulation unit, into I and Q component signals, which are analog data, a Direct Component (DC) correction and low pass filter unit adjusting DC interfaces of the I and Q component signals, which are analog data, passing low frequency components of the analog I and Q component signals and generating I and Q components of a base-band signal, a local oscillator generating a sine wave signal with a frequency of $F_{TX}/2^N$, (N is a natural number equal to or greater than 1), a poly phase signal generation unit receiving the sine wave signal and generating a poly phase signal with $2^{N+1}$ phases, a $2^N$-order sub-harmonic I/Q frequency modulation unit mixing the I and Q components of the base-band signal with the poly phase signal with $2^{N+1}$ phases, respectively, to generate an output signal with a frequency of $F_{TX}$, a power amplification unit amplifying the output signal of the $2^N$-order sub-harmonic I/Q frequency modulation unit to a required level, and an antenna radiating the output signal of the power amplification unit.

Further, the present invention provides a direct conversion transmitter, comprising a digital modulation unit digitally modulating a base-band signal and then outputting I and Q component signals, a digital/analog conversion unit converting the I and Q component signals, which are output from the digital modulation unit, into I and Q component signals, which are analog data, a Direct Component (DC) correction and low pass filter unit adjusting DC interfaces of the I and Q component signals, which are analog data, passing low frequency components of the analog I and Q component signals and generating I and Q components of a base-band signal, a local oscillator generating a sine wave signal with a frequency of $F_{TX}/N$, (N is an odd number equal to or greater than 3), a poly phase signal generation unit receiving the sine wave signal and generating a poly phase signal with 2N phases, a N-order sub-harmonic I/Q frequency modulation unit mixing the I and Q components of the base-band signal with the poly phase signal, respectively, to generate an output signal with a frequency of $F_{TX}$, a power amplification unit amplifying the output signal of the N-order sub-harmonic I/Q frequency modulation unit to a required level, and an antenna radiating the output signal of the power amplification unit.

Further, the present invention provides a direct conversion transmitter, comprising a digital modulation unit digitally modulating a base-band signal and then outputting I and Q component signals, a digital/analog conversion unit converting the I and Q component signals, which are output from the digital modulation unit, into I and Q component signals, which are analog data, a Direct Component (DC) correction and low pass filter unit adjusting DC interfaces of the I and Q component signals, which are analog data, passing low frequency components of the analog I and Q component signals and generating I and Q components of a base-band signal, a poly phase local oscillator generating a poly phase sine wave signal with a frequency of $F_{TX}/N$ and 2N phases (N is a natural number equal to or greater than 2), a N-order sub-harmonic I/Q frequency modulation unit mixing the I and Q components of the base-band signal with the poly phase sine wave signal, respectively, to generate an output signal with a frequency of $F_{TX}$, a power amplification unit amplifying the output signal of the N-order sub-harmonic I/Q frequency modulation unit to a required level, and an antenna radiating the output signal of the power amplification unit.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, embodiments of a $2^N$-order sub-harmonic frequency modulator having a high carrier suppression ratio, and a direct conversion transmitter using the frequency modulator according to the present invention will be described in detail with reference to the attached drawings.

Figure 2:
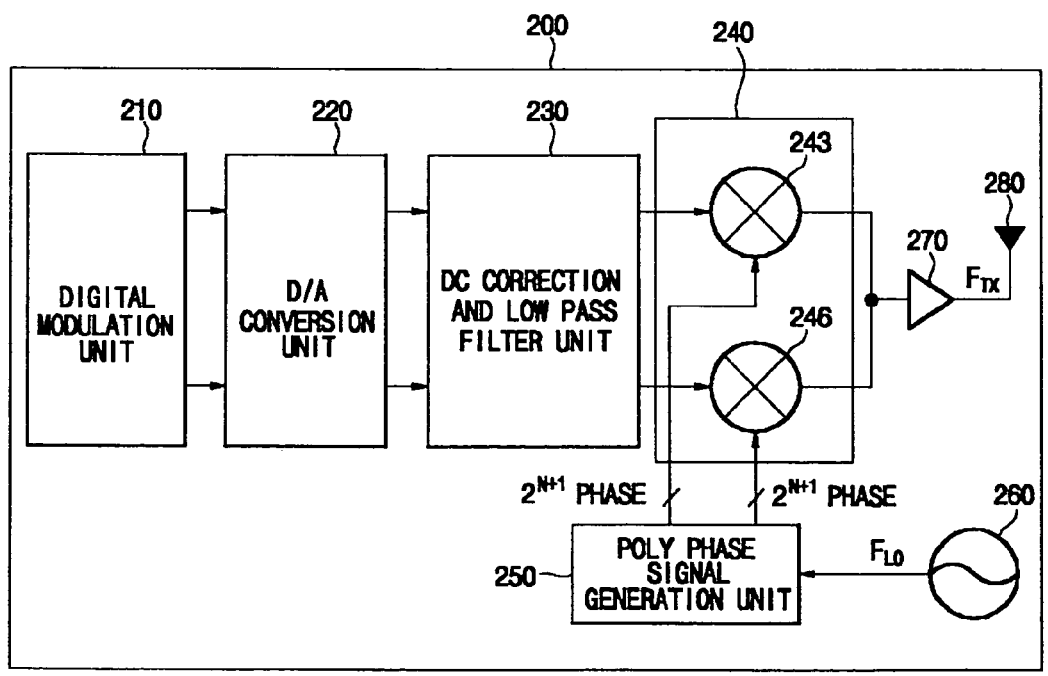
FIG. 2 is a block diagram of a direct conversion transmitter according to an embodiment of the present invention.

FIG. 2 is a block diagram showing the construction of a direct conversion transmitter according to an embodiment of the present invention. As shown in FIG. 2, a direct conversion transmitter 200 of the present invention includes a digital modulation unit 210, a D/A conversion unit 220, a DC correction and low pass filter unit 230, a $2^N$-order sub-harmonic I/Q frequency modulation unit 240, a poly phase signal generation unit 250, a local oscillator 260, a power amplification unit 270, and an antenna 280.

The digital modulation unit 210 digitally modulates a base-band signal, and then outputs In-phase (I) and Quadrature-phase (Q) component signals.

The D/A conversion unit 220 converts the I and Q component signals, which are output from the digital modulation unit 210, into I and Q component signals, which are analog data.

The DC correction and low pass filter unit 230 adjusts the DC interfaces of the I and Q component signals, which are the analog data, passes the low frequency components of the I and Q component signals, and then generates I and Q components of a base-band signal.

The local oscillator 260 generates a sine wave signal with a frequency of $F_{TX}/2^N$ (N is a natural number equal to or greater than 1), where $F_{TX}$ is the frequency of the output signal of the direct conversion transmitter.

The poly phase signal generation unit 250 receives the sine wave signal to generate a poly phase signal with $2^{N+1}$ phases.

For example, the poly phase generation unit 250 generates a poly phase sine wave signal having $2^{1+1}=4$ different phases when N=1, and generates a poly phase sine wave signal having $2^{2+1}=8$ different phases when N=2.

In detail, when N=1, the poly phase sine wave signal having four different phases, such as 0°, 90°, 180° and 270°, is generated. When N=2, the poly phase sine wave signal having eight different phases, such as 0°, 45°, 90°, 135°, 180°, 225°, 270°, and 315°, is generated.

Generally, when N=K, a phase increases from 0° to 360° by $180/2^{K}$°, so that a poly phase sine wave signal with $2*2^K$ different phases is generated.

The $2^N$-order sub-harmonic I/Q frequency modulation unit 240 mixes the I and Q components of the base-band signal with the poly phase signal having $2^{N-1}$ phases, respectively, and then generates an output signal with a frequency of $F_{TX}$. In this case, the term $2^N$-order sub-harmonic modulation is used to indicate that a signal with a frequency of $1/2^N$ of $F_{TX}$ is received. The $2^N$-order sub-harmonic I/Q frequency modulation unit 240 includes the I-modulation unit 243 and the Q-modulation unit 246.

The power amplification unit 270 amplifies the output signal of the $2^N$-order sub-harmonic I/Q frequency modulation unit 240 to a required level.

The antenna 280 radiates the output signal of the power amplification unit 270 to the air.

As described above, in the direct conversion transmitter of the present invention, the output frequency $F_{TX}$ of the power amplification unit 270 and the frequency $F_{LO}$ of the local oscillator 260 are not equal to each other, so that the TXLO-IP phenomenon does not occur even though the high output of the power amplification unit 270 is injected into the local oscillator 260.

Generally, a N-poly phase signal generation unit, which is complicated to implement, may be sometimes required. Further, when N is an odd number, odd-order harmonics are generated, thus degrading the output spectrum of the direct conversion transmitter. Because of this fact, the present invention employs a construction which suppresses the odd-order harmonics using the poly phase signal generation unit 250 having $2^{N+1}$ phases.

Hereinafter, the $2^N$-order sub-harmonic I/Q frequency modulator of the present invention is described in detail with reference to the attached drawings.

Figure 1:
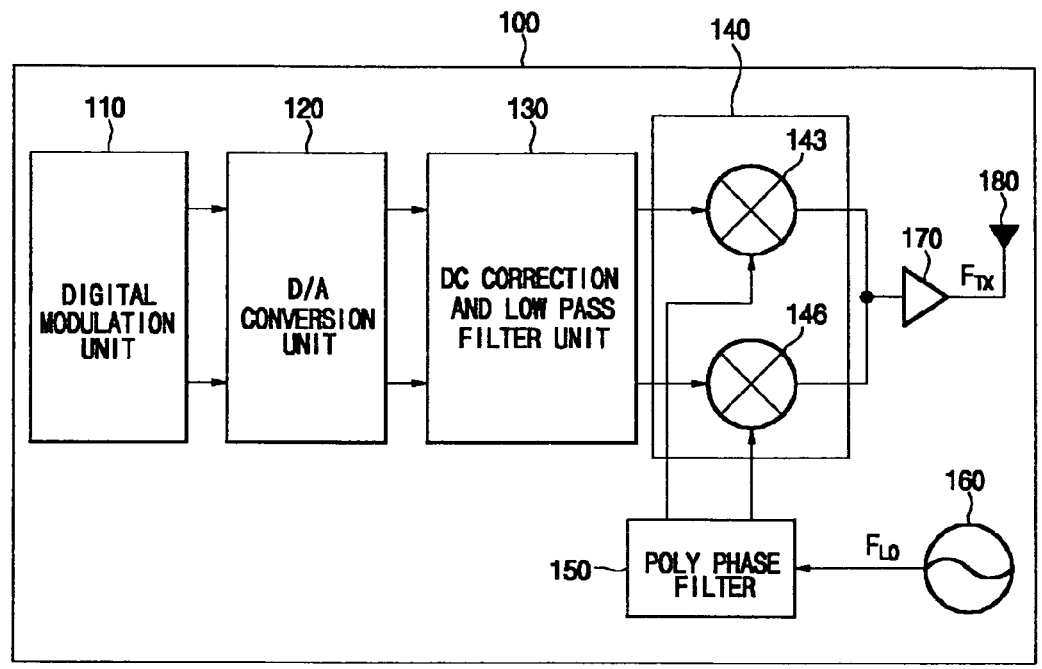
FIG. 1 is a block diagram showing an example of a conventional direct conversion transmitter.
Figure 3:
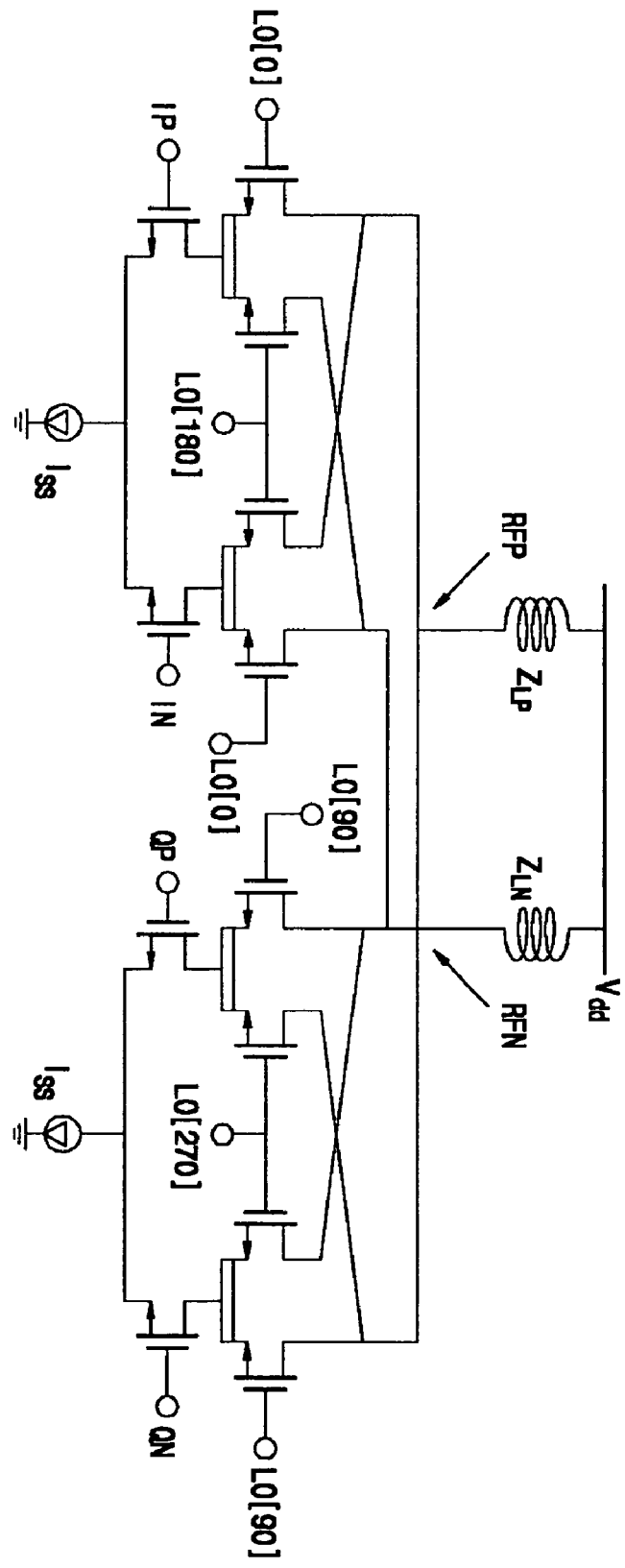
FIG. 3 is a circuit diagram of a conventional I/Q frequency modulator.

FIG. 3 illustrates a conventional I/Q modulator using a Gilbert-cell topology. The conventional I/Q modulator of FIG. 3 is described with reference to the direct conversion transmitter of FIG. 1. The output signal of the local oscillator 160 is converted into output signals having phases of 0°, 90°, 180° and 270°, respectively, by the poly phase filter 150. The output signals of the poly phase filter 150 having the phases are applied to the gates of transistors of FIG. 3 as gate input signals. In FIG. 3, LO[0], LO[180], LO[90] and LO[270] respectively represent the phases of the signals that are output from the poly phase filter 150 after the output signal of the local oscillator 160 has passed through the poly phase filter 150, and will be applied to the gates of the transistors. In detail, the Lo[0], LO[90], LO[180] and LO[270] represent a signal with a phase of 0°, a signal with a phase of 90°, a signal with a phase of 180°, and a signal with a phase of 270°, respectively. Further, in FIG. 3, IP and IN represent positive and negative component signals of the I component of the base-band signal, respectively, and QP and QN represent positive and negative component signals of the Q component of the base-band signal, respectively.

In FIG. 3, the I/Q modulator receives the I and Q components of the base-band signal and poly phase components of the oscillation signal, generated by the local oscillator, through the respective input components IP, IN, QP, QN, LO[0], LO[180], LO[90] and LO[270], and then outputs components RFP and RFN by the reception of the input components. The output components RFP and RFN are amplified by the power amplification unit 170 and radiated to the air through the antenna 180. In FIG. 3, impedances $Z_{LP}$ and $Z_{LN}$ function as loads.

In case of the conventional I/Q modulator, the output frequency $F_{TX}$ thereof and the frequency $F_{LO}$ of the local oscillator are the same, and a TXLO-IP phenomenon occurs when the high output signal of the power amplification unit is injected into the local oscillator.

Figure 4:
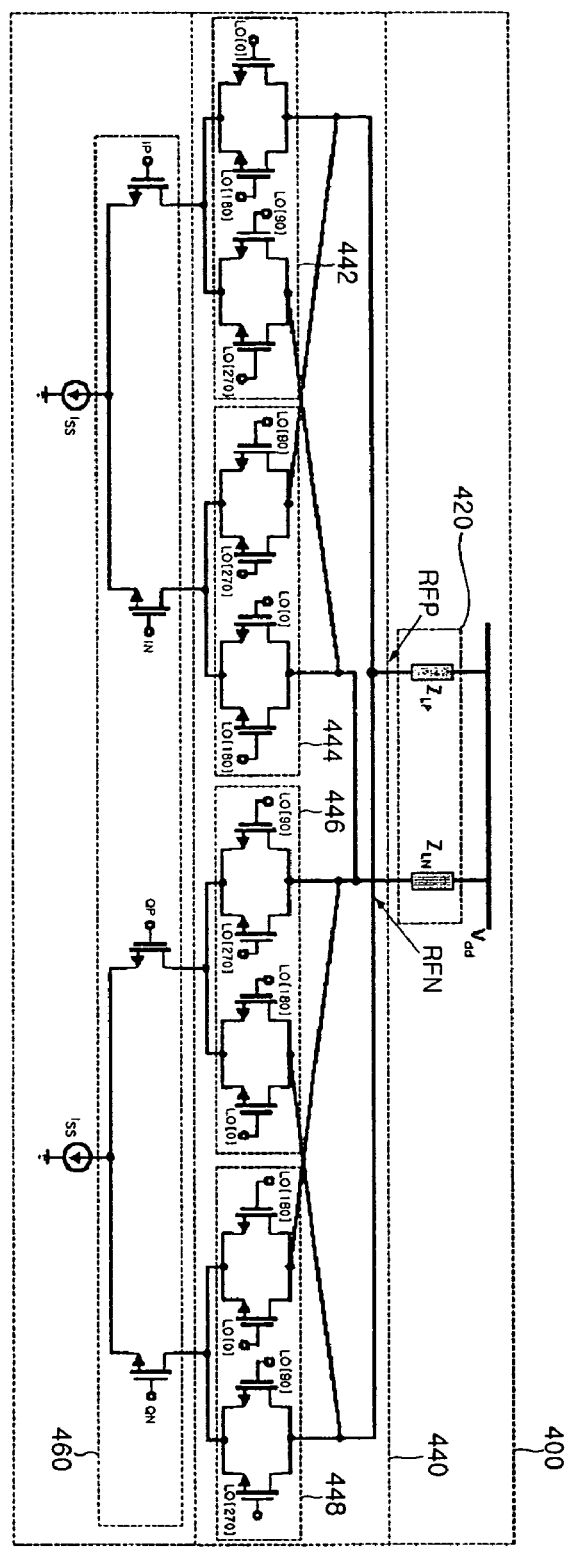
FIG. 4 is a circuit diagram of a $2^N$-order sub-harmonic I/Q frequency modulator at N=1 according to an embodiment of the present invention.

FIG. 4 is a circuit diagram of a $2^1$-order sub-harmonic I/Q frequency modulator at N=1 according to the present invention. As shown in FIG. 4, a $2^1$-order sub-harmonic I/Q frequency modulator 400 includes a load unit 420, a switching unit 440, an I/Q input unit 460, and an output unit RFP and RFN. The switching unit 440 includes an I switching unit 442 and 444 and a Q switching unit 446 and 448.

The load unit 420 includes impedance components $Z_{LP}$ and $Z_{LN}$, which can each be composed of a resistor, a capacitor and an inductor, so that it can function as a filter while functioning as a load.

The switching unit 440 is comprised of four switching components 442, 444, 446 and 448 each including four transistors, and classified into the I switching unit 442 and 444 and the Q switching unit 446 and 448. The I switching unit 442 and 444 functions to modulate the poly phase signal of the local oscillator input thereto and the I component signals, and the Q switching unit 446 and 448 functions to modulate the poly phase signal of the local oscillator input thereto and the Q component signals.

The signals LO[0], LO[180], LO[90] and LO[270], input to the respective switching components, represent the phases of a poly phase signal that is output from the poly phase generator after a signal generated by the local oscillator is converted into the poly phase signal by the poly phase generator, in which LO[0], LO[90], LO[180] and LO[270] represents a signal with a phase of 0°, a signal with a phase of 90°, a signal with a phase of 180°, and a signal with a phase of 270°, respectively.

The I/Q input unit 460 is comprised of four transistors, in which input signals IP and IN are the positive and negative component signals of the I component of the base-band signal, and input signals QP and QN are the positive and negative component signals of the Q component of the base-band signal.

The output unit RFP and RFN outputs a Radio Frequency (RF) signal with a frequency of $F_{TX}$ through the above-described modulation. The output signals RFP and RFN of the output unit are later amplified by the power amplification unit 270 and radiated to the air through the antenna 280.

The $2^1$-order sub-harmonic I/Q frequency modulator 400 receives and modulates a signal Lo with a frequency of $F_{TX}/2^1$ and then outputs the signal with a frequency of $F_{TX}$, thus preventing the TXLO-IP phenomenon from occurring even though the high output signal of the power amplification unit is injected into the local oscillator.

Figure 5:
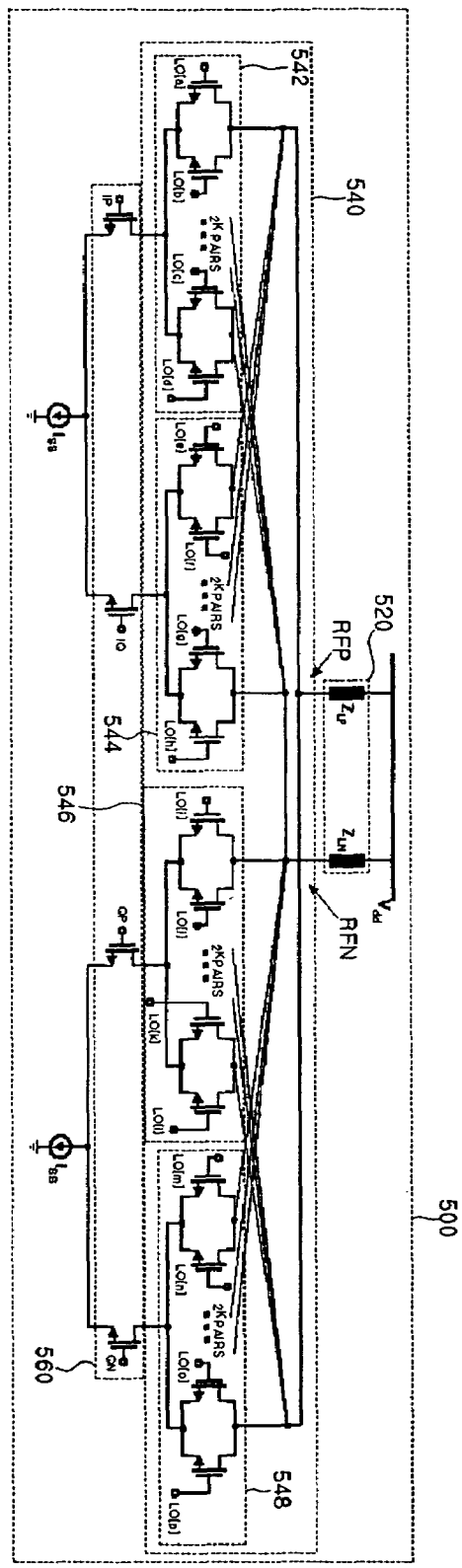
FIG. 5 is a circuit diagram of a $2^N$-order sub-harmonic I/Q frequency modulator according to an embodiment of the present invention.

FIG. 5 is a circuit diagram of a $2^K$-order sub-harmonic frequency modulator at N=K in the direct conversion transmitter of the present invention. As shown in FIG. 5, a $2^K$-order sub-harmonic frequency modulator 500 includes a load unit 520, a switching unit 540, an I/Q input unit 560 and an output unit RFP and RFN.

The load unit 520 includes impedance components $Z_{LP}$ and $Z_{LN}$, which can each be composed of a resistor, a capacitor and an inductor, so that it can function as a filter while functioning as a load.

The switching unit 540 is comprised of four switching components 542, 544, 546 and 548 each including $2^K$ transistor pairs, that is, $2*2^K$ transistors. The switching unit 540 can be classified into an I switching unit 542 and 544 and a Q switching unit 546 and 548. The I switching unit 542 and 544 functions to modulate the poly phase signal of the local oscillator input thereto and the I component signals, and the Q switching unit 546 and 548 functions to modulate the poly phase signal of the local oscillator input thereto and the Q component signals.

The phases of signals input to the first switching component 542 are expressed by $[0+180/2^K*(i-1), 180+180/2^K*(i-1)]$, with respect to each of $2^K$ transistor pairs, where i is 1 to $2^K$. Therefore, the phases LO[a] and LO[b] of the signals input to the first transistor pair are LO[0] and LO[180], respectively, and the phases LO[c] and LO[d] of signals input to the last transistor pair are $LO[180-180/2^K]$ and $LO[360-180/2^K]$, respectively.

Similar to the first switching component 542, the phases of the signals input to the second switching component 544 are expressed by $[180/2^K 180/2^K*(i-1), 180+180/2^K 180/2^K*(i-1)]$ with respect to each of $2^K$ transistor pairs, where i is 1 to $2^K$. Therefore, the phases LO[e] and LO[f] of the signals input to the first transistor pair are $LO[180/2^K]$ and $LO[180+180/2^K]$, respectively, and the phases LO[g] and LO[h] of the signals input to the last transistor pair are $LO[180+180/2^K-1]$ and $LO[180/2^{K-1}]$, respectively.

The phases of the signals input to the respective transistors of the third switching component 546 are obtained by shifting the phases of the signals input to the respective transistors of the first switching component 542 by 90°, and expressed by $[90+180/2^K*(i-1), 270+180/2^K*(i-1)]$, where i is 1 to $2^K$. Therefore, the phases LO[i] and LO[j] of the signals input to the first transistor pair are LO[90] and LO[270], respectively. The phases LO[k] and LO[l] of the signals input to the last transistor pair are $LO[270-180/2^K]$ and $LO[90-180/2^K]$, respectively.

The phases of the signals input to the respective transistors of the fourth switching component 548 are obtained by shifting the phases of the signals input to the respective transistors of the second switching component 544 by 90°, and expressed by $[90+180/2^K 180/2^K*(i-1), 270+180/2^K 180/2^K*(i-1)]$, where i is to $2^K$. Therefore, the phases LO[m] and LO[n] of signals input to the first transistor pair are $LO[90+180/2^K]$ and $LO[270+180/2^K]$, respectively. The phases of LO[o] and LO[p] of the signals input to the last transistor pair are $LO[270+180/2^{K-1}]$ and $LO[90+180/2^{K-1}]$, respectively.

The I/Q input unit 560 is comprised of four transistors, in, which input signals IP and IN represent positive and negative component signals of the I component of the base-band signal, respectively, and QP and QN represent positive and negative component signals of the Q component of the base-band signal, respectively.

The output unit RFP and RFN outputs RF signals with a frequency of $F_{TX}$ through the above-described modulation. The output signals RFP and RFN of the output unit are later amplified by the power amplification unit and radiated to the air through the antenna.

The $2^K$-order sub-harmonic I/Q frequency modulator 400 receives and modulates a signal LO with a frequency of $F_{TX}/2^K$ and outputs a signal with a frequency of $F_{TX}$, thus preventing the TXLO-IP phenomenon from occurring even though the high output signal of the power amplification unit is injected into the local oscillator.

Figure 6:
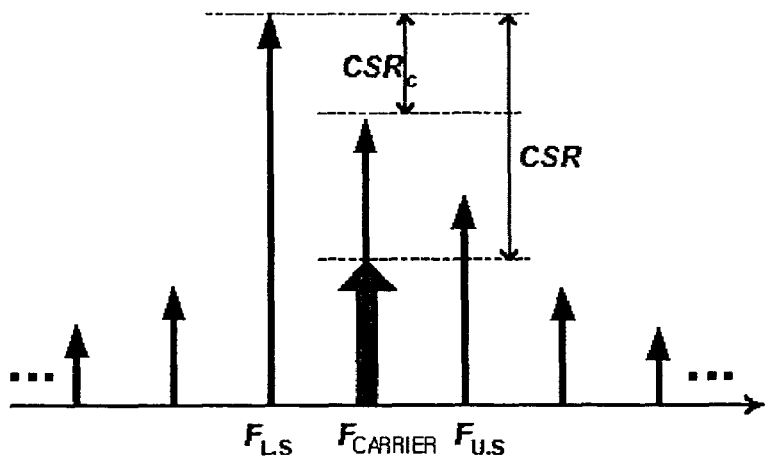
FIG. 6 is view comparing the carrier suppression ratios of the conventional direct conversion transmitter and the direct conversion transmitter of the present invention with each other.

FIG. 6 is view comparing the carrier suppression ratio characteristics of the outputs of a conventional direct conversion transmitter and the direct conversion transmitter of the present invention with each other. In FIG. 6, $F_{LS}$ represents a lower side band frequency, $F_{CARRIER}$ represents a carrier frequency, $F_{US}$ represents an upper side band frequency, and a Carrier Suppression Ratio (CSR) is defined by a ratio of required side band signal power to carrier signal power. As shown in FIG. 6, on the basis of $F_{LS}$, the power at $F_{CARRIER}$ of the transmitter of the present invention decreases compared to the power at $F_{CARRIER}$ of the conventional transmitter. Therefore, it can be seen that the carrier suppression ratio CSRi of the transmitter of the present invention is greater than the carrier suppression ratio CSRc of the conventional transmitter.

Figure 7:
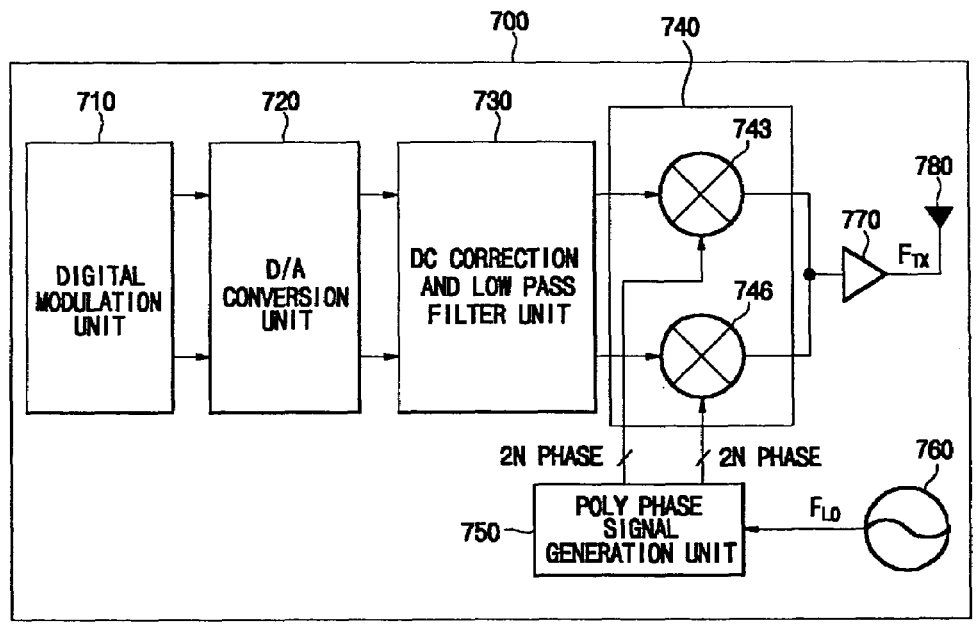
FIG. 7 is a block diagram of a direct conversion transmitter according to another embodiment of the present invention.

FIG. 7 is a block diagram of a direct conversion transmitter according to another embodiment of the present invention. As shown in FIG. 7, a direct conversion transmitter 700 of the present invention includes a digital modulation unit 710, a D/A conversion unit 720, a DC correction and low pass filter unit 730, a N-order sub-harmonic I/Q frequency modulation unit 740, a poly phase signal generation unit 750, a local oscillator 760, a power amplification unit 770 and an antenna 780.

The functions of the digital modulation unit 710, the D/A conversion unit 720, the DC conversion and low pass filter unit 730, the power amplification unit 770 and the antenna 780 are equal to those of the digital modulation unit 210, the D/A conversion unit 220, the DC correction and low pass filter unit 230, the power amplification unit 270 and the antenna 280 of the direct conversion transmitter of FIG. 2, so that a detailed description thereof is omitted.

The local oscillator 760 generates a sine wave signal with a frequency of $F_{TX}/N$ (N is an odd number equal to or greater than 3). In this case, there is a complication in implementation compared to the local oscillator 260 of FIG. 2 that generates a $F_{TX}/2^N$-order frequency, but there is an advantage in that the allocation of frequencies to the entire transmitter can be flexibly designed. Therefore, the local oscillator 760 can generate and use the sine wave signal with a frequency of $F_{TX}/N$.

The poly phase signal generation unit 750 receives the sine wave signal and then generates a poly phase signal having 2N phases. For example, when N=3, the poly phase signal generation unit 750 generates a poly phase sine wave signal with six phases, that is, 0°, 60°, 120°, 180°, 240° and 300°.

The N-order sub-harmonic I/Q frequency modulation unit 740 mixes the I and Q components of the base-band signal with the poly phase signal, respectively, and generates an output signal with a frequency of $F_{TX}$. In this case, the term N-order sub-harmonic modulation is used to indicate that a signal with a frequency of 1/N of the output frequency $F_{TX}$ is received.

Similar to the $2^N$-order sub-harmonic I/Q frequency modulator of FIG. 5, the N-order sub-harmonic I/Q frequency modulation unit 740 includes an I/Q input unit that receives I and Q component signals, an I switching unit that receives and modulates sub-harmonic signals with a frequency of $F_{TX}/N$ and $2^N$ phases (N is a natural number equal to or greater than 2) and the I component signals and then outputs a signal with a frequency of $F_{TX}$, a Q switching unit that receives and modulates the sub-harmonic signals and the Q component signals and then outputs a signal with a frequency of $F_{TX}$, a load unit functioning as a load, and an output unit (not shown) that provides the outputs of the I and Q switching units as RF signals. Typically, N is a natural number equal to or greater than 2, but it can be limited to an odd number equal to or greater than 3 in the N-order sub-harmonic I/Q frequency modulation unit of the present invention if a poly phase local oscillator 860 of FIG. 8 is not used.

The I switching unit includes two switching components (first and second switching components) each comprised of N transistor pairs. The phases of the signals input to each of the transistor pairs of the first switching component are expressed by [0+180/N*(i−1), 180+180/N*(i−1)], where i is 1 to N. Further, the phases of the signals input to each of the transistor pairs of the second switching component are expressed by [180/N−180/N*(i−1), 180+180/N−180/N*(i−1)], where i is 1 to N. The Q switching unit includes two switching components (third and fourth switching components), each comprised of N transistor pairs. The phases of the signals input to each of the transistor pairs of the third switching component are expressed by [90+180/N*(i−1), 270+180/N*(i−1)], where i is 1 to N. Further, the phases of the signals input to each of the transistor pairs of the fourth switching component are expressed by [90+180/N−180/N*(i−1), 270+180/N−180/N*(i−1)], where i is 1 to N. Further, the load unit is comprised of impedance components including a resistor, a capacitor and an inductor.

For example, at N=3, sine wave signals having phases [0, 180], [60, 240], and [120, 300], respectively, are input to the transistor pairs of the first switching component of the I switching unit. Further, sine wave signals with phases [60, 240], [0, 180] and [300, 120], respectively, are input to the transistor pairs of the second switching component. Further, sine wave signals with phases obtained by adding 90° to the phases of the first and second switching components are input to the transistor pairs of the third and fourth switching components of the Q switching unit, respectively. Such a N-order sub-harmonic I/Q frequency modulation unit is advantageous in the design and implementation of frequencies, especially when N is an odd natural number.

Figure 8:
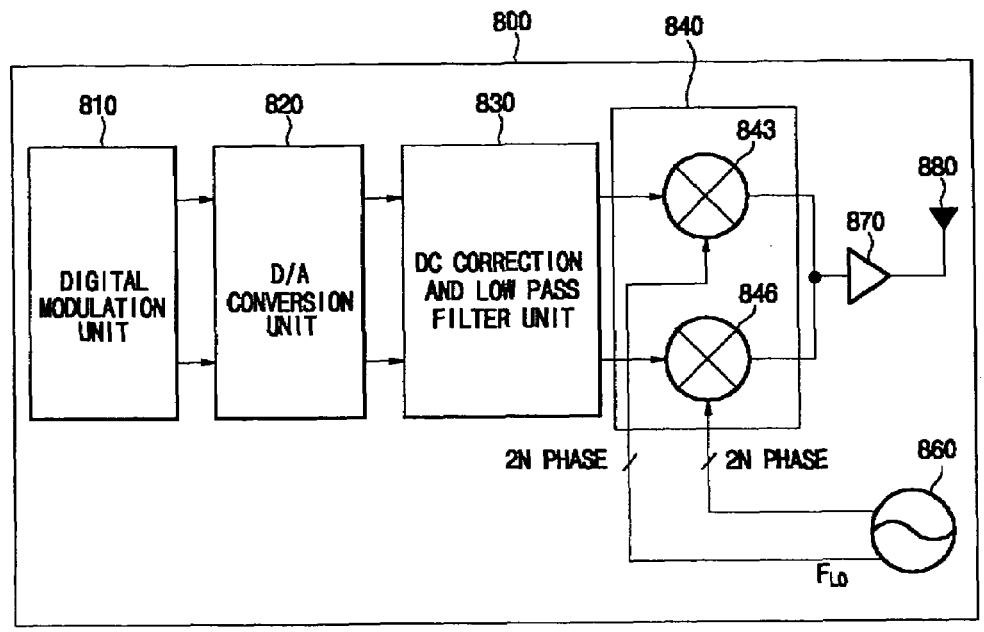
FIG. 8 is a block diagram of a direct conversion transmitter according to a further embodiment of the present invention.

FIG. 8 is a block diagram of a direct conversion transmitter according to a further embodiment of the present invention. As shown in FIG. 8, a direct conversion transmitter 800 of the present invention includes a digital modulation unit 810, a D/A conversion unit 820, a DC correction and low pass filter unit 830, a N-order sub-harmonic I/Q frequency modulation unit 840, a poly phase local oscillator 860, a power amplification unit 870 and an antenna 880.

The functions of the digital modulation unit 810, the D/A conversion unit 820, the DC correction and low pass filter unit 830, the power amplification unit 870, and the antenna 880 are equal to those of the digital modulation unit 210, the D/A conversion unit 220, the DC correction and low pass filter unit 230, the power amplification unit 270 and the antenna 280 of FIG. 2, respectively, so that a detailed description thereof is omitted.

The block diagram of the direct conversion transmitter of FIG. 8 is greatly different from that of the direct conversion transmitter of FIG. 2 or 7 in the poly phase signal generation unit 250 or 750. The direct conversion transmitter of FIG. 8 generates a sine wave signal with a frequency of $F_{TX}/N$ (N is a natural number equal to or greater than 1) through the use of the poly phase local oscillator 860 that generates a poly phase sine wave signal. For example, such a poly phase local oscillator 860 can be implemented using a ring oscillator.

The poly phase local oscillator 860 generates a poly phase sine wave signal with a frequency of $F_{TX}/N$ and $2^N$ phases, where N is a natural number equal to or greater than 2.

The N-order sub-harmonic I/Q frequency modulation unit 840 mixes the I and Q components of a base-band signal with the poly phase sine wave signal, respectively, and then generates an output signal with a frequency of $F_{TX}$. In this case, the term N-order sub-harmonic modulation is used to indicate that a signal with a frequency of 1/N of the output frequency $F_{TX}$ is received.

Figure 9A:
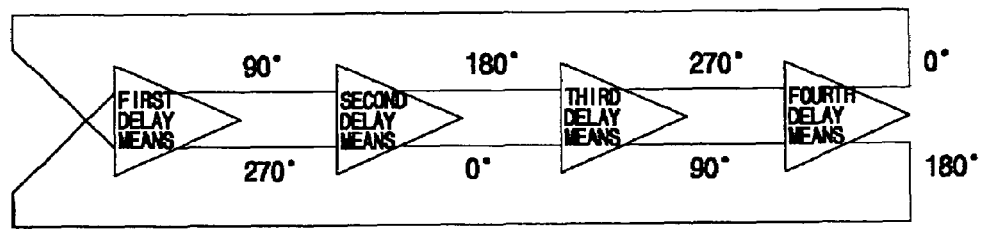
FIGS. 9a-9c are block diagrams of a ring oscillator used in the direct conversion transmitter of the present invention.
Figure 9B:
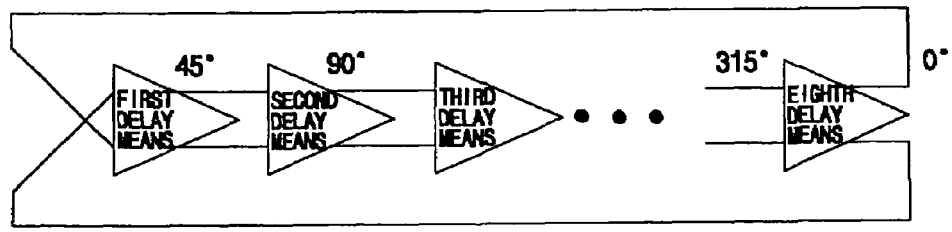
Figure 9C:
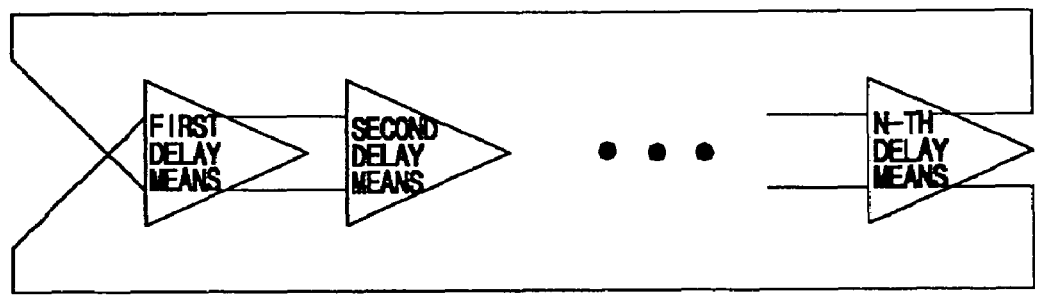

FIGS. 9a to 9c are block diagrams of examples of a ring oscillator generating a poly phase signal. As shown in FIG. 9a to 9c, the ring oscillator is implemented in such a way that a plurality of phase delay means are connected in multiple stages to generate a signal with a plurality of phases.

That is, FIG. 9a is a block diagram of a four-stage ring oscillator that generates a poly phase signal with phases of 0°, 90°, 180° and 270° using four phase delay means. FIG. 9b is a block diagram of an eight-stage ring oscillator that generates a poly phase signal with phases of 0°, 45°, 90°, 135°, 180°, 225°, 270° and 315° using eight phase delay means. Further, FIG. 9c is a block diagram of a N-stage ring oscillator having N stages to generate a sine wave signal with a total of $2^N$ phases.

The generation of a poly phase signal using the ring oscillator can be applied to systems without strict conditions for phase margin, for example, Low-Rate Wireless Personal Area Networks (LR-WPAN) and Wideband Code Division Multiple Access (WCDMA) systems.

As described above, the present invention provides a direct conversion transmitter, which employs a $2^N$-order sub-harmonic frequency modulator, so that a transmission (Tx) output-to-Local Oscillator (LO) injection pulling (TXLO-IP) problem is fully solved and Carrier Suppression Ratio (CSR) characteristics are improved, thus reducing power consumption, realizing a small-sized transmitter, and reducing manufacturing costs.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An I/Q frequency modulator for a direct conversion transmitter, comprising:
   an I/Q input unit receiving In-phase (I) and Quadrature-phase (Q) component signals;
   an I switching unit receiving and modulating sub-harmonic signals with a frequency of $F_{TX}/2^N$ and $2^{N+1}$ phases, where N is a natural number equal to or greater than 1, and the I component signals and outputting a signal with a frequency of $F_{TX}$;
   a Q switching unit receiving and modulating the sub-harmonic signals and the Q component signals and outputting a signal with a frequency of $F_{TX}$;
   a load unit functioning as a load; and
   an output unit providing output signals of the I and Q switching units as Radio Frequency (RF) signals, wherein the I switching unit includes a first and a second switching components, each comprised of $2^N$ transistor pairs, the first switching component having each transistor pair that receives signals with phases expressed by $[0+180/2^{N}*(i-1), 180+180/2^{N}*(i-1)]$, where i is a natural number ranging from 1 to $2^N$, the second switching component having each transistor pair that receives signals with phases expressed by $[180/2^{N}-180/2^{N}*(i-1), 180+180/2^{N}-180/2^{N}*(i-1)]$, where i is a natural number ranging from 1 to $2^N$, and wherein the Q switching unit includes a third and a fourth switching components, each comprised of $2^N$ transistor pairs, the third switching component having each transistor pair that receives signals with phases expressed by $[90+180/2^{N}*(i-1), 270+180/2^{N}*(i-1)]$, where i is a natural number ranging from 1 to $2^N$, the fourth switching component having each transistor pair that receives signals with phases expressed by $[90+180/2^{N}-180/2^{N}*(i-1), 270+180/2^{N}180/2^{N}*(i-1)]$, where i is a natural number ranging from 1 to $2^N$.

2. The I/Q frequency modulator according to claim 1, wherein the load unit includes impedance components including at least one resistor, at least one capacitor and at least one inductor.

3. An I/Q frequency modulator for a direct conversion transmitter, comprising:
  an I/Q input unit receiving In-phase (I) and Quadrature-phase (Q) component signals;
  an I switching unit receiving and modulating sub-harmonic signals with a frequency of $F_{TX}/N$ and 2N phases, where N is a natural number equal to or greater than 2, and the I component signals and outputting a signal with a frequency of $F_{TX}$;
  a Q switching unit receiving and modulating the sub-harmonic signals and the Q component signals and outputting a signal with a frequency of $F_{TX}$;
  a load unit functioning as a load; and
  an output unit providing output signals of the I and Q switching units as Radio Frequency (RF) signals,
  wherein the I switching unit includes a first and a second switching components, each comprised of N transistor pairs, the first switching component having each transistor pair that receives signals with phases expressed by $[0-180/N*(i-1), 180+180/N*(i-1)]$, where i is a natural number ranging from 1 to N, the second switching component having each transistor pair that receives signals with phases expressed by $[180/N-180/N*(i-1), 180+180/N-180/N*(i-1)]$, where i is a natural number ranging from 1 to N, and
  wherein the Q switching unit includes a third and a fourth switching components, each comprised of N transistor pairs, the third switching component having each transistor pair that receives signals with phases expressed by $[90+180/N*(i-1), 270+180/N*(i-1)]$, where i is a natural number ranging from 1 to N, the fourth switching component having each transistor pair that receives signals with phases expressed by $[90+180/N-180/N*(i-1), 270+180/N-180/N*(i-1)]$ where i is a natural number ranging from 1 to N.

4. The I/Q frequency modulator according to claim 3, wherein the load unit includes impedance components including at least one resistor, at least one capacitor and at least one inductor.

5. A direct conversion transmitter, comprising:
  a digital modulation unit digitally modulating a base-band signal and then outputting In-phase (I) and Quadrature-phase (Q) component signals;
  a digital/analog conversion unit converting the I and Q component signals, which are output from the digital modulation unit, into I and Q component signals, which are analog data;
  a Direct Component (DC) correction and low pass filter unit adjusting DC interfaces of the I and Q component signals, which are analog data, passing low frequency components of the analog I and Q component signals and generating I and Q components of a base-band signal;
  a local oscillator generating a sine wave signal with a frequency of $F_{TX}/2^N$, where N is a natural number equal to or greater than 1;
  a poly phase signal generation unit receiving the sine wave signal and generating a poly phase signal with $2^{N+1}$ phases;
  a $2^N$-order sub-harmonic I/Q frequency modulation unit mixing the I and Q components of the base-band signal with the poly phase signal with $2^{N+1}$ phases, respectively, to generate an output signal with a frequency of $F_{TX}$;
  a power amplification unit amplifying the output signal of the $2^N$-order sub-harmonic I/Q frequency modulation unit to a required level; and
  an antenna radiating the output signal of the power amplification unit.

6. A direct conversion transmitter, comprising:
  a digital modulation unit digitally modulating a base-band signal and then outputting In-phase (I) and Quadrature-phase (Q) component signals;
  a digital/analog conversion unit converting the I and Q component signals, which are output from the digital modulation unit, into I and Q component signals, which are analog data;
  a Direct Component (DC) correction and low pass filter unit adjusting DC interfaces of the I and Q component signals, which are analog data, passing low frequency components of the analog I and Q component signals and generating I and Q components of a base-band signal;
  a local oscillator generating a sine wave signal with a frequency of $F_{TX}/N$, where N is an odd number equal to or greater than 3;
  a poly phase signal generation unit receiving the sine wave signal and generating a poly phase signal with 2N phases;
  a N-order sub-harmonic I/Q frequency modulation unit mixing the I and Q components of the base-band signal with the poly phase signal, respectively, to generate an output signal with a frequency of $F_{TX}$;
  a power amplification unit amplifying the output signal of the N-order sub-harmonic I/Q frequency modulation unit to a required level; and
  an antenna radiating the output signal of the power amplification unit.

7. A direct conversion transmitter, comprising:
  a digital modulation unit digitally modulating a base-band signal and then outputting In-phase (I) and Quadrature-phase (Q) component signals;
  a digital/analog conversion unit converting the I and Q component signals, which are output from the digital modulation unit, into I and Q component signals, which are analog data;
  a Direct Component (DC) correction and low pass filter unit adjusting DC interfaces of the I and Q component signals, which are analog data, passing low frequency components of the analog I and Q component signals and generating I and Q components of a base-band signal;

a poly phase local oscillator generating a poly phase sine wave signal with a frequency of $F_{TX}/N$ and 2N phase, where N is a natural number equal to or greater than 2;

a N-order sub-harmonic I/Q frequency modulation unit mixing the I and Q components of the base-band signal with the poly phase sine wave signal, respectively, to generate an output signal with a frequency of $F_{TX}$;

a power amplification unit amplifying the output signal of the N-order sub-harmonic I/Q frequency modulation unit to a required level; and an antenna radiating the output signal of the power amplification unit.

8. The direct conversion transmitter according to claim 7, wherein the poly phase local oscillator is a ring oscillator having N-stages.

\* \* \* \* \*